US009214557B2

(12) United States Patent
Tan et al.

(10) Patent No.: US 9,214,557 B2
(45) Date of Patent: Dec. 15, 2015

(54) DEVICE WITH ISOLATION BUFFER

(71) Applicant: GLOBALFOUNDRIES Singapore Pte. Ltd., Singapore (SG)

(72) Inventors: Dexter Xueming Tan, Singapore (SG); Eng Huat Toh, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 18 days.

(21) Appl. No.: 14/173,821

(22) Filed: Feb. 6, 2014

(65) Prior Publication Data

US 2015/0221761 A1   Aug. 6, 2015

(51) Int. Cl.
| | |
|---|---|
| *H01L 29/78* | (2006.01) |
| *H01L 29/66* | (2006.01) |
| *H01L 29/06* | (2006.01) |
| *H01L 21/762* | (2006.01) |
| *H01L 21/265* | (2006.01) |
| *H01L 21/3105* | (2006.01) |

(52) U.S. Cl.
CPC ........ *H01L 29/785* (2013.01); *H01L 21/26513* (2013.01); *H01L 21/31053* (2013.01); *H01L 21/76243* (2013.01); *H01L 29/0649* (2013.01); *H01L 29/6681* (2013.01)

(58) Field of Classification Search
CPC .......... H01L 29/785–29/7856; H01L 29/6681; H01L 29/66795–29/66818; H01L 21/76243
See application file for complete search history.

(56) References Cited

U.S. PATENT DOCUMENTS

| | | | |
|---|---|---|---|
| 6,605,514 B1 * | 8/2003 | Tabery et al. | 438/303 |
| 8,420,459 B1 * | 4/2013 | Cheng et al. | 438/149 |
| 8,785,284 B1 * | 7/2014 | Bergendahl et al. | 438/296 |
| 8,823,060 B1 * | 9/2014 | Colinge et al. | 257/192 |
| 2005/0051825 A1 * | 3/2005 | Fujiwara et al. | 257/308 |
| 2005/0093074 A1 * | 5/2005 | Anderson et al. | 257/365 |
| 2005/0098822 A1 * | 5/2005 | Mathew et al. | 257/314 |
| 2005/0124101 A1 * | 6/2005 | Beintner | 438/197 |
| 2006/0189058 A1 * | 8/2006 | Lee et al. | 438/198 |
| 2006/0244051 A1 * | 11/2006 | Izumida et al. | 257/327 |
| 2008/0073667 A1 * | 3/2008 | Lochtefeld | 257/190 |
| 2008/0079003 A1 * | 4/2008 | Shaheen et al. | 257/64 |
| 2008/0251843 A1 * | 10/2008 | Nakajima | 257/347 |
| 2009/0179244 A1 * | 7/2009 | Ono | 257/295 |
| 2010/0140709 A1 * | 6/2010 | Mouli | 257/349 |
| 2010/0155842 A1 * | 6/2010 | Anderson et al. | 257/347 |
| 2010/0163971 A1 * | 7/2010 | Hung et al. | 257/327 |
| 2011/0147840 A1 * | 6/2011 | Cea et al. | 257/347 |
| 2011/0171795 A1 * | 7/2011 | Tsai et al. | 438/232 |
| 2011/0291100 A1 * | 12/2011 | Cheng et al. | 257/66 |
| 2012/0168913 A1 * | 7/2012 | Toh et al. | 257/618 |
| 2012/0171832 A1 * | 7/2012 | Toh et al. | 438/300 |
| 2013/0001750 A1 * | 1/2013 | Arnold et al. | 257/618 |
| 2013/0181264 A1 * | 7/2013 | Liao et al. | 257/288 |
| 2013/0187207 A1 * | 7/2013 | Tang et al. | 257/288 |

(Continued)

OTHER PUBLICATIONS

Wood, B. "Fin Doping by Hot Implant for 14 nm FinFET Technology and Beyond" ECS Trans. 2013, vol. 58, Iss. 9 pp. 249-256.*

*Primary Examiner* — Matthew Landau
*Assistant Examiner* — Grant Withers
(74) *Attorney, Agent, or Firm* — Horizon IP PTE Ltd

(57) ABSTRACT

Devices and methods for forming a device are presented. A substrate prepared with a device region is provided. A fin is formed in the device region. The fin includes top and bottom portions. An amorphous isolation buffer is formed at least in the bottom fin portion, leaving the top fin portion crystalline. The top fin portion serves as a body of a fin type transistor.

20 Claims, 23 Drawing Sheets

(56) References Cited

U.S. PATENT DOCUMENTS

| | | | |
|---|---|---|---|
| 2013/0187228 A1* | 7/2013 | Xie et al. | 257/347 |
| 2013/0193481 A1* | 8/2013 | Bryant et al. | 257/192 |
| 2014/0065775 A1* | 3/2014 | Chien et al. | 438/197 |
| 2014/0124860 A1* | 5/2014 | Cheng et al. | 257/347 |
| 2014/0231915 A1* | 8/2014 | Leobandung | 257/347 |
| 2014/0264228 A1* | 9/2014 | Toh et al. | 257/4 |
| 2014/0299934 A1* | 10/2014 | Kim et al. | 257/347 |
| 2014/0346603 A1* | 11/2014 | Toh et al. | 257/350 |
| 2014/0353731 A1* | 12/2014 | Colinge et al. | 257/288 |
| 2015/0028426 A1* | 1/2015 | Ching et al. | 257/401 |
| 2015/0048295 A1* | 2/2015 | Park | 257/2 |
| 2015/0048296 A1* | 2/2015 | Park | 257/2 |
| 2015/0093868 A1* | 4/2015 | Obradovic et al. | 438/283 |

* cited by examiner

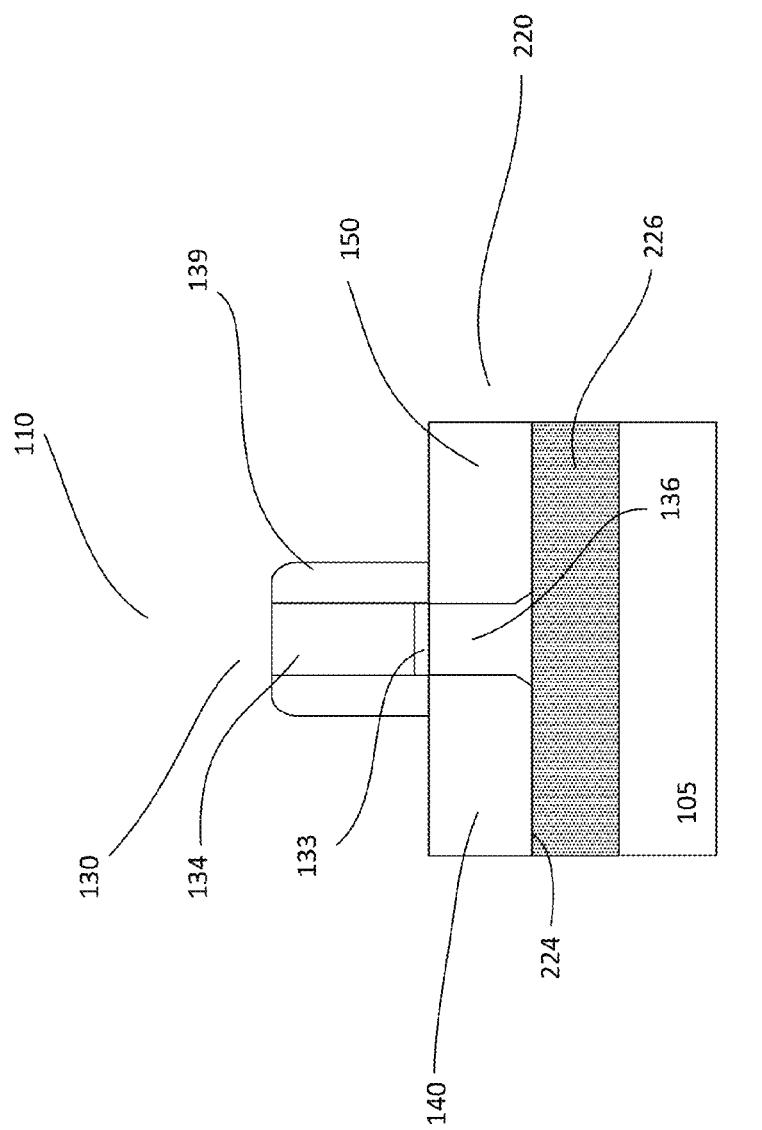

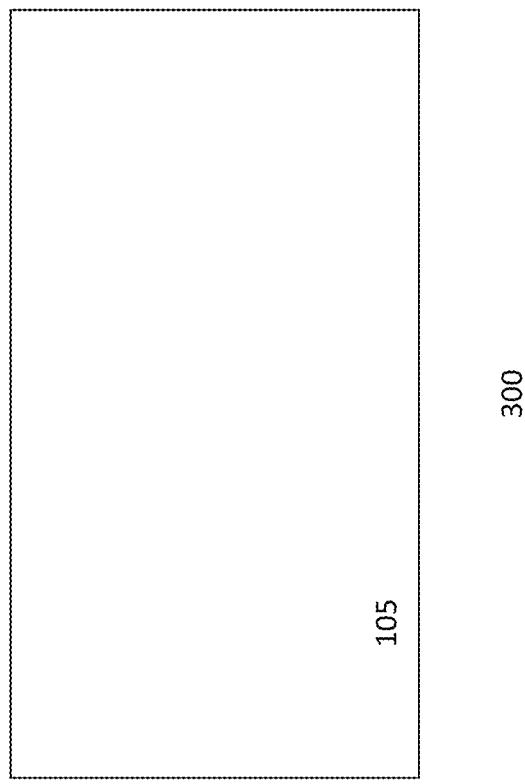

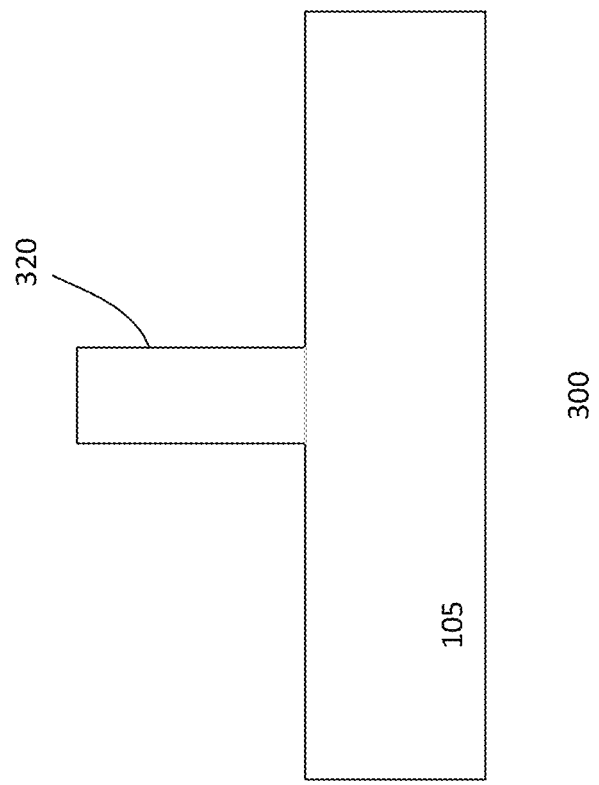

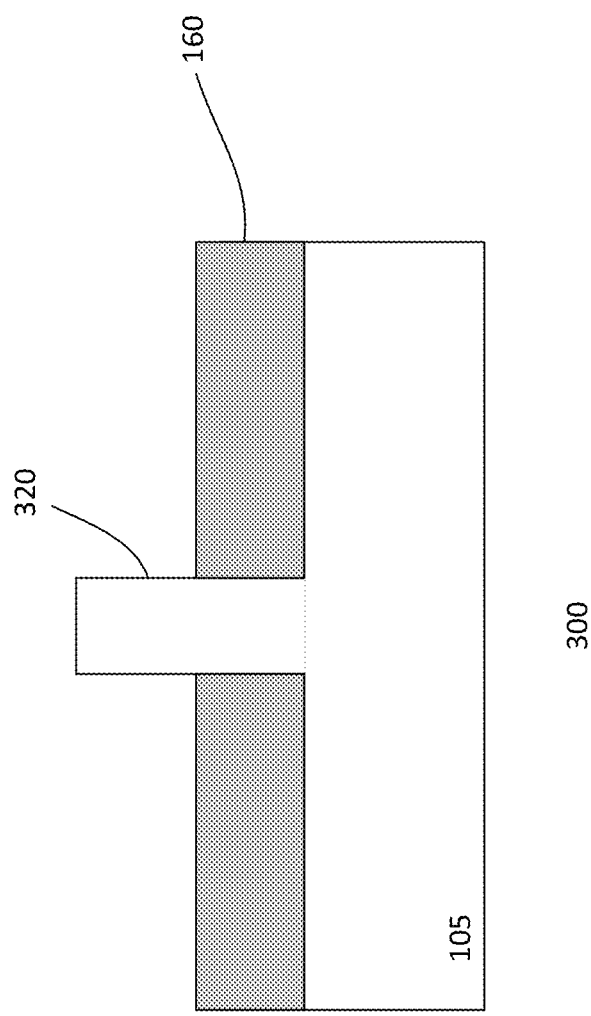

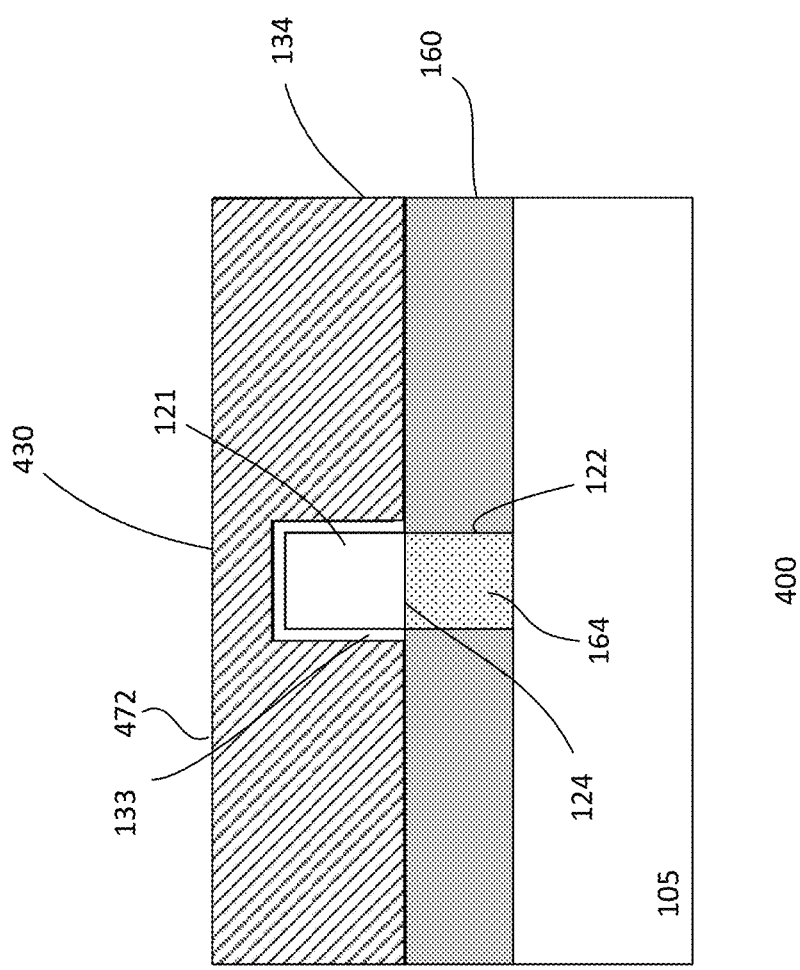

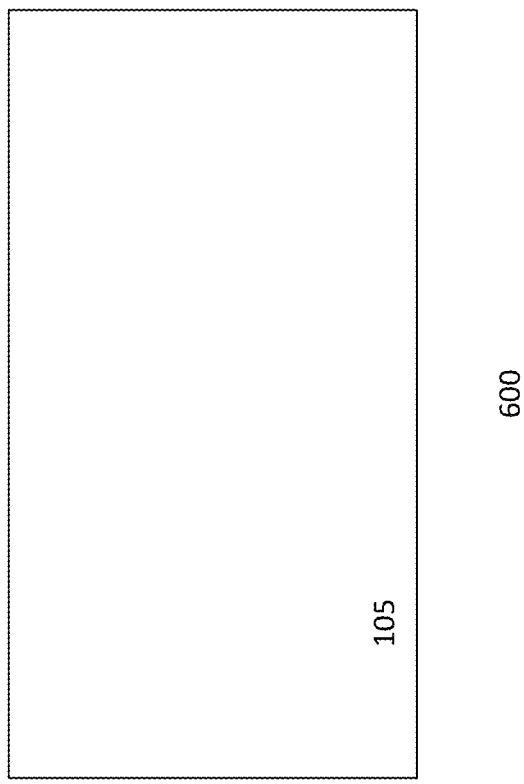

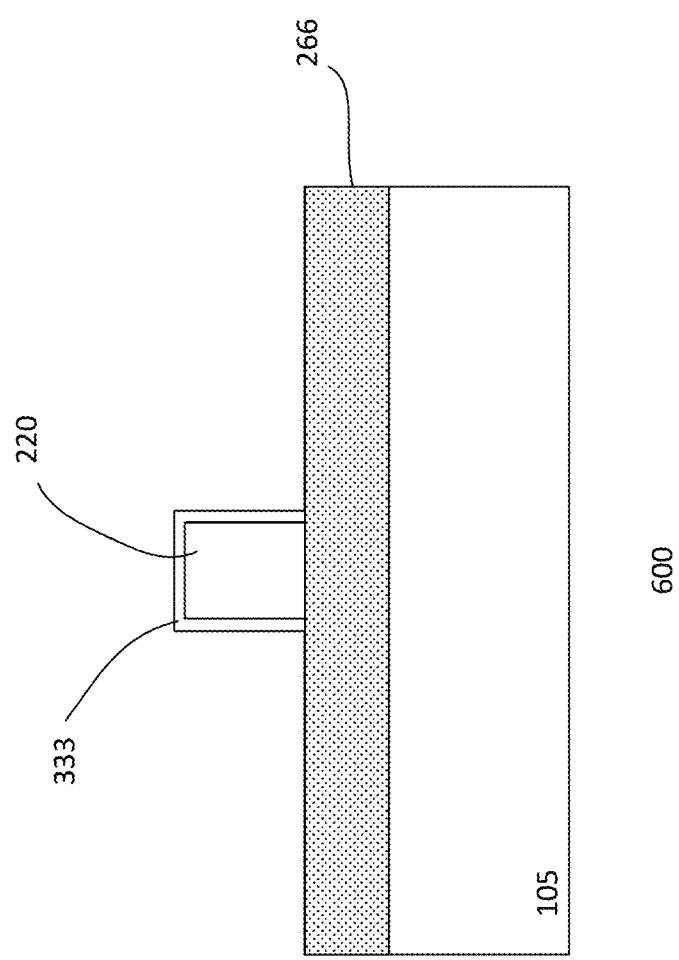

DEVICE WITH ISOLATION BUFFER

BACKGROUND

Transistors, such as but not limited to fin-type transistors, have been investigated for future generation of devices, such as for sub-22 nm technology. However, conventional transistors exhibit high parasitic junction capacitance, which undesirably decrease performance. This undesirable result negatively impacts its performance.

From the foregoing discussion, it is desirable to provide a device with improved performance for use in nanoscale technologies.

SUMMARY

Embodiments generally relate to devices and methods for forming a device. In one embodiment, a method for forming a device is disclosed. The method includes providing a substrate prepared with a device region. A fin is formed in the device region. The fin includes top and bottom portions. An amorphous isolation buffer is formed at least in the bottom fin portion, leaving the top fin portion crystalline. The top fin portion serves as a body of a fin type transistor.

In another embodiment, a method for forming a device is presented. The method includes providing a substrate prepared with a device region. A transistor is formed in the device region. The transistor includes a gate disposed over the substrate. Source/drain (S/D) regions are formed adjacent to the gate. An amorphous isolation buffer is formed at least below the gate. The amorphous isolation buffer reduces S/D junction current leakage.

In yet another embodiment, a device is presented. The device includes a substrate prepared with a device region and a fin disposed in the device region. The fin includes top and bottom portions. The device also includes an amorphous isolation buffer disposed at least in the bottom fin portion, leaving the top fin portion crystalline. The top fin portion serves as a body of a fin type transistor.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2c show various views of another embodiment of a device;

FIGS. 3a-3f show an embodiment of a process of forming a device;

FIGS. 4a-4d show another embodiment of a process for forming a device;

FIGS. 6a-6d show yet another embodiment of a process for forming a device.

DETAILED DESCRIPTION

The embodiments generally relate to devices, such as semiconductor devices or ICs. More particularly, some embodiments relate to transistors employed to form ICs. The ICs can be any type of IC. For example, the IC may be a dynamic or static random access memory, a signal processor, or a system on chip (SoC) device. The ICs can be incorporated into, for example, consumer electronic products, such as computers, cell phones, and personal digital assistants (PDAs). Other types of devices or products are also useful.

Figure 1A:
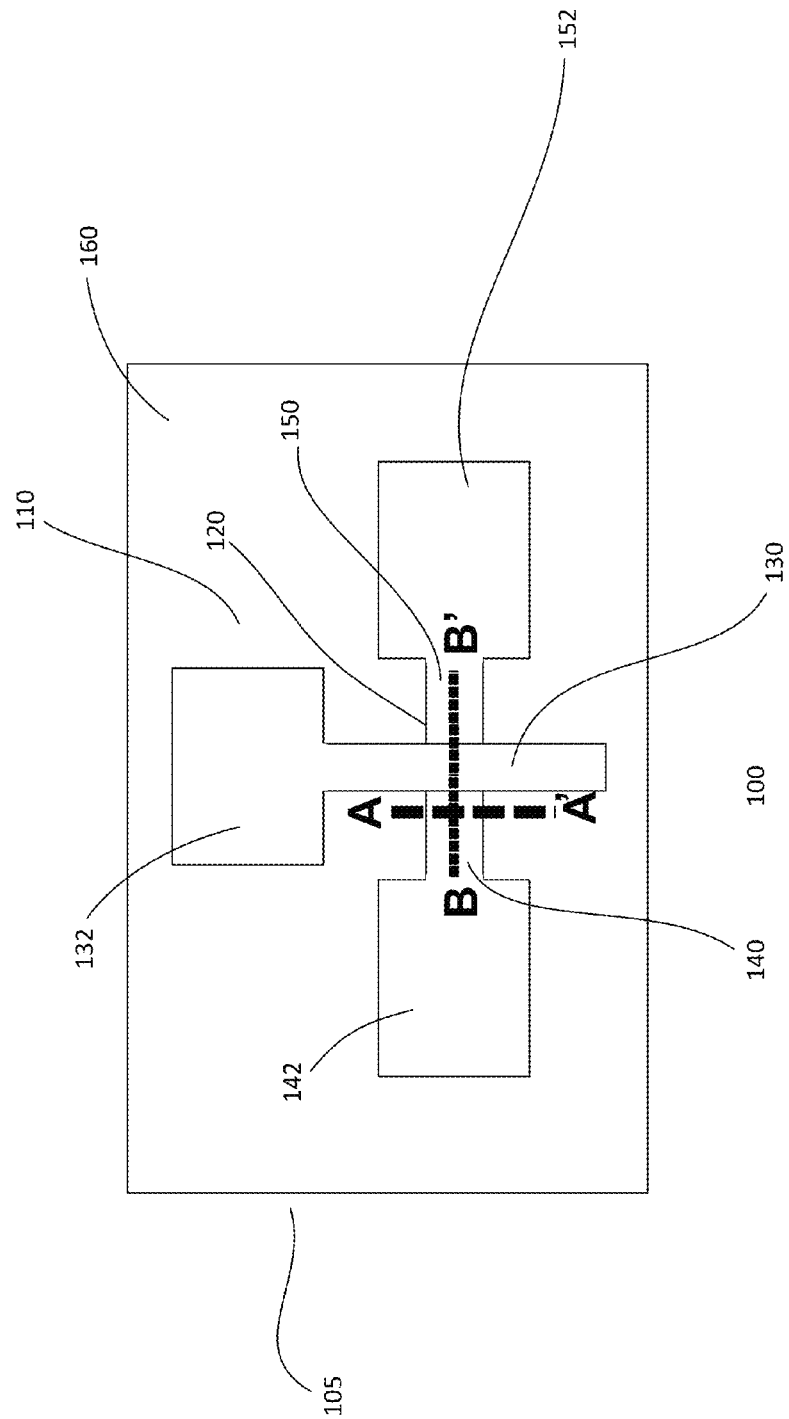
FIGS. 1a-1c show various views of an embodiment of a device.
Figure 1B:
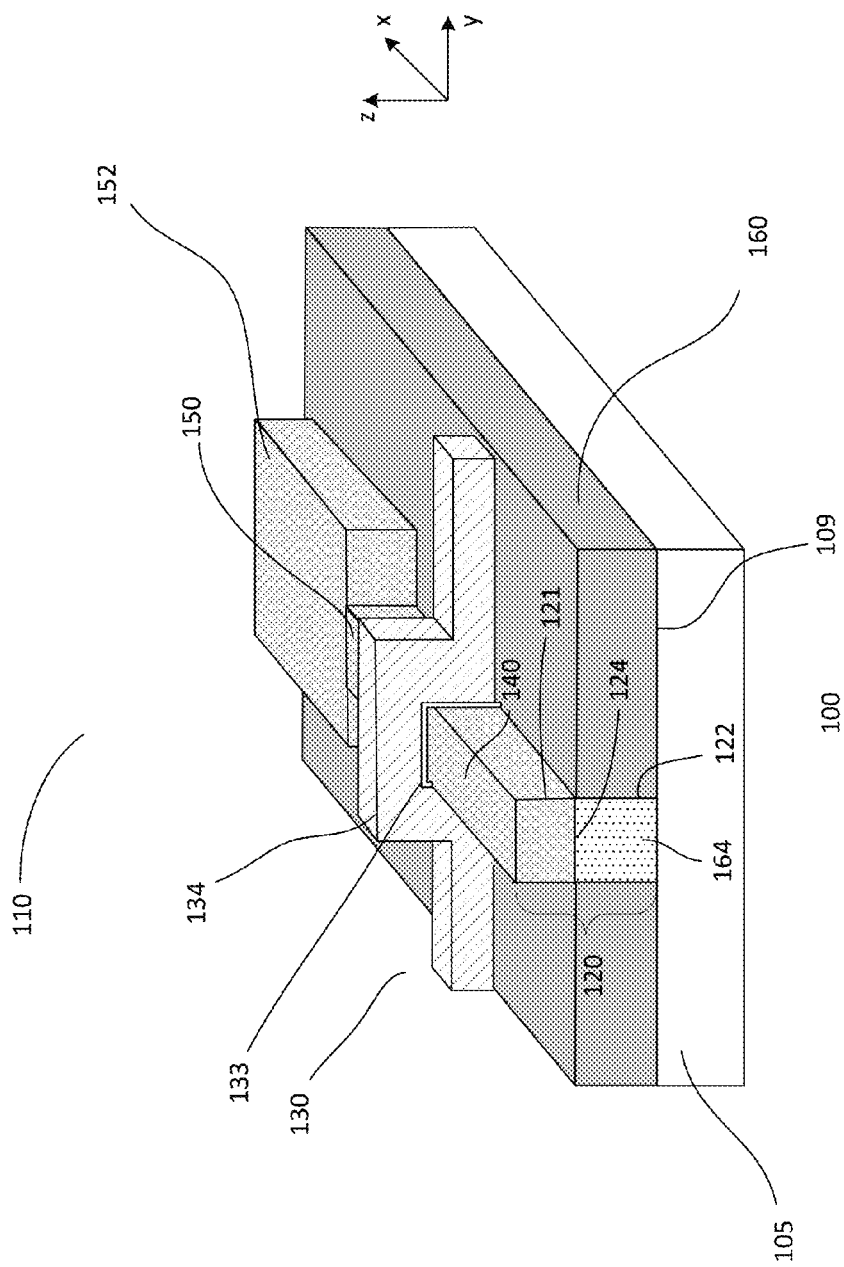
Figure 1C:
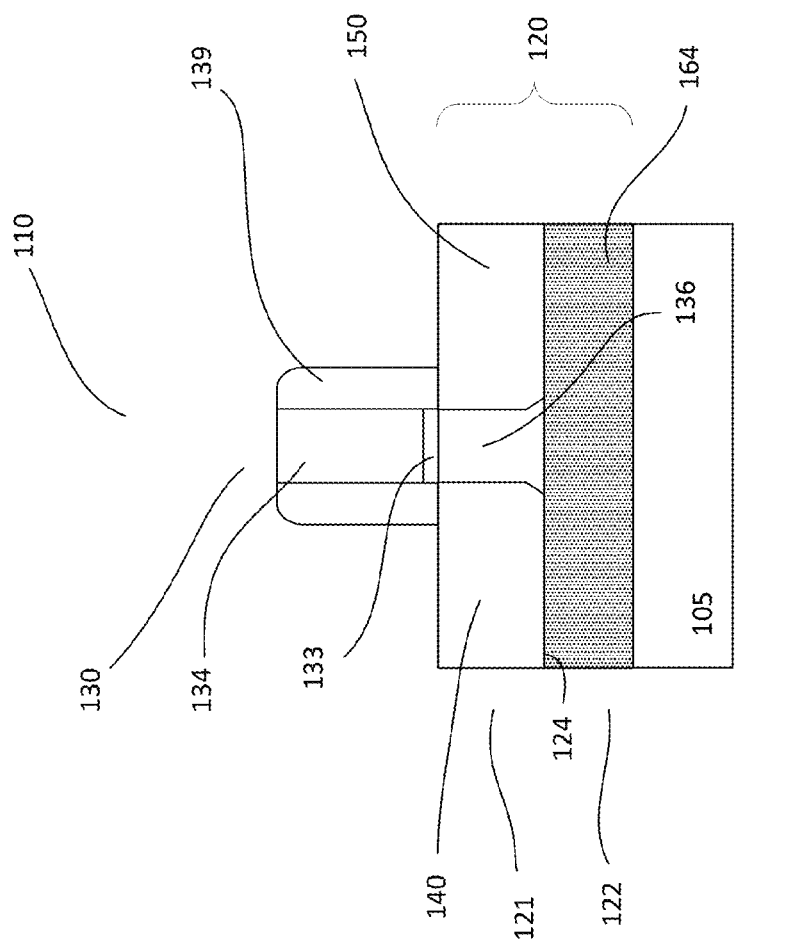

FIGS. 1a-1c show various views of a device 100. FIG. 1a shows a top view while FIG. 1b shows a 3-dimensional view of the device along A-A' and FIG. 1c shows a cross-sectional view of the device along B-B'. The device, for example, is an integrated circuit (IC). Other types of devices may also be useful. Referring to FIGS. 1a-1c, a substrate 105 serves as a base for the device. The substrate, for example, includes a silicon substrate. The substrate may be a lightly doped substrate. For example, the substrate may be a lightly doped p-type (p) substrate. In some embodiments, the substrate may be a lightly doped n-type (n) substrate. Other types of substrates may also be useful. For example, the substrate may be a heavily p-doped ($p^+$) or n-doped ($n^+$), intrinsic substrate or a substrate having other types of semiconductor materials, such as silicon-germanium (SiGe), germanium (Ge), gallium-arsenic (GaAs) or any other suitable semiconductor materials, including subsequently developed materials.

The substrate is prepared with a device region for a transistor 110. For illustration purpose, the transistor, for example, is shown as a fin-type transistor such as finFET. It is understood that the transistor is not limited to fin-type transistor and may include other suitable types of transistors. The device may include other device regions (not shown). For example, the substrate may include other device regions for which other types of transistors or components of the IC may be formed. For example, the substrate may include p-type and n-type components, such as high, medium and low voltage p-type and n-type components. Various types of n-type and p-type wells are provided for these components. P-type dopants can include boron (B), aluminum (Al), indium (In) or a combination thereof, while n-type dopants can include phosphorus (P), arsenic (As), antimony (Sb) or a combination thereof.

The device region, for example, may be isolated from other device regions by, for example, an isolation layer 160. The isolation layer is disposed on a surface 109 of the substrate. The isolation layer, in one embodiment, includes a dielectric layer such as silicon oxide. In other embodiments, the isolation layer may be silicon nitride. Other types of dielectric layers, including multiple dielectric layers, may also be useful. For example, the isolation layer may be a second dielectric layer over a first dielectric layer. The second dielectric layer may serve as an etch stop to protect the first dielectric layer. For example, a silicon nitride layer may be provided over a silicon oxide layer or a silicon oxide layer may be provided over a silicon nitride layer. The isolation layer serves to electrically isolate the transistor from the substrate. The thickness of the isolation layer, for example, may be about 100-500 nm. In other embodiments, the thickness of the dielectric layer may be about 200-400 nm. Other suitable thickness ranges may also be useful. The thicker the isolation layer, the better the isolation.

The transistor, in one embodiment, includes a fin structure 120. The fin structure extends from the top surface of the substrate to above the top surface of the isolation layer. For example, the fin structure is disposed on the top surface of the substrate. The fin structure is an elongated member with a rectangular cross-section. Other types of fin structures may also be useful. As shown, the fin structure is disposed along a first direction (e.g., x direction).

The fin structure is formed of a material capable of having good or high carrier mobility. For example, the fin structure includes a crystalline material, such as silicon. Other fin materials, such as SiGe, Ge or GaAs or a combination of the various crystalline materials may also be employed. The fin, in one embodiment, is an integral part of the substrate. For example, the fin structure is formed from patterning the substrate. In such cases, the fin structure has the same material as the substrate. In other embodiments, the fin may be an epitaxial layer formed and processed on the surface of the substrate. In such cases, the fin structure may be of the same or different material from the substrate. In such cases, the fin may be of the same or different material from the substrate. Other suitable configurations of the fin may also be useful.

The fin structure includes top and bottom fin portions 121 and 122. The top fin portion serves as a body of the transistor. The top fin portion includes material capable of having good or high carrier mobility, such as a crystalline material. As for the bottom fin portion, it serves as an isolation buffer, separating the top fin portion or body of the transistor from the substrate.

For example, an isolation buffer layer 164 is disposed in the bottom fin portion 122. In one embodiment, an interface 124 of the top and bottom fin portions is at about the top surface of the isolation layer 160. Providing the interface above or below the isolation layer may also be useful. The bottom fin portion should be sufficiently thick to isolate the body of the transistor from the substrate. For example, the bottom fin portion should have a height sufficient to isolate the body of the transistor from the substrate. The height of the bottom fin portion may be about 200-400 nm. In other embodiments, the bottom fin portion is about 230-350 nm in height. Other suitable height dimension for the bottom fin portion may also be useful. The height of the bottom fin portion, for example, may be tuned or varied to achieve the desired substrate integrity.

As for the top fin portion 121, the thickness defines the device height. The height of the top fin portion determines the device height. For example, the height of the top fin portion may factor in determining a channel width of the device. Exemplary height of the top fin portion may be about 50-200 nm. In some embodiments, the height of the top fin portion is about 60-150 nm. The width of the top fin portion may be about 10-100 nm. In some cases, the width of the fin may be included in determining the channel width of the device. Other dimensions for the top fin portion may also be useful. The dimensions of the fin, for example, may depend on device or design requirements.

The top fin portion 121, as discussed, serves as the body of the transistor. The top fin portion serves as the device's channel region. The top fin portion may be an intrinsic top fin portion. In some embodiments, the fin structure may be a lightly doped fin structure having second polarity type dopants. The second polarity type doped fin structure is used for, for example, a first polarity type device. For example, the fin structure may include p-type dopants for an n-channel device or n-type dopants for a p-channel device. For example, in the case where the fin is integral to the substrate, it would have the same polarity type as the substrate.

As for the bottom fin portion 122, the isolation buffer layer 164, in one embodiment, is an amorphized silicon ($\alpha$-Si) layer. In one embodiment, the $\alpha$-Si buffer layer is implanted with amorphizing dopants. The amorphizing dopants, for example, include silicon ions ($Si^+$). Other suitable types of amorphizing dopants, such as but not limited to $Ge^+$, may also be useful. The dopants are implanted by, for example, high energy implantation (HEI). The HEI is performed at, for example, 160 KeV with a dose of about 5e14-9e14 atom/$cm^2$. Providing other suitable implant energies and doses may also be useful. The implant parameters, such as the energy and dose, may be tuned or tailored to produce amorphous layer having the desired depth and thickness to achieve the desired effect. For example, higher dose and energy may be employed to create a thicker amorphous layer. Implanting the amorphizing ions by cold or molecular/cluster implantation may also be useful. Other suitable types of techniques may also be used.

By implanting amorphizing dopants into the fin structure, an isolation buffer layer is formed in the bottom fin portion. The top fin portion remains crystalline. A vacancy rich crystalline layer is disposed in the crystalline top portion. The isolation buffer layer is sandwiched between the substrate and top fin portion. By adjusting the energy and dose of the implantation, the location and thickness of the isolation buffer layer can be controlled. This also controls the thickness or height of the top fin portion.

A gate 130 is disposed on the isolation layer 160. The gate, for example, is an elongated member with a rectangular cross-section. Other types of gates may also be useful. In one embodiment, the gate is disposed on the dielectric layer along a second direction (e.g., y direction) and traverses the fin. The second direction, for example, is perpendicular to the first direction. Providing first and second directions which are not perpendicular to each other may also be useful. The isolation layer 160, for example, provides isolation to prevent the region under the gate on the isolation layer from turning on. The gate, as shown, wraps around the fin.

The gate, in one embodiment, includes a gate electrode 134 and a gate dielectric 133. The gate dielectric layer, for example, is disposed between the gate electrode and the fin. The gate electrode, for example, is a polysilicon gate electrode. Other types of gate electrode materials may also be useful. For example, the gate electrode may be a metal gate electrode, such as TaN or TiN gate electrode. As for the gate dielectric layer, it may be silicon oxide. Other types of gate dielectric material may also be useful. For example, the gate dielectric layer may be HfSiON, SiON or $HfO_2$. In some embodiments, the gate dielectric may further include a work function tuning layer. For example, $La_2O_3$ may be provided for a n-type device while TiN/Al/TiN may be provided for a p-type device in addition to HfSiON and/or $HfO_2$. Other suitable types of work function tuning layer may also be useful.

Dielectric spacers 139 may be provided on sidewalls of the gate. The dielectric spacers, for example, may be silicon nitride. Other types of dielectric materials may also be used. For example, the spacers may be silicon nitride or multiple layers of dielectric materials, such as silicon oxide and silicon nitride. In other embodiments, no dielectric spacers are provided on the gate sidewalls.

First and second source/drain (S/D) regions 140 and 150 are disposed in the fin adjacent to the gate. The S/D regions include dopants of a first polarity type for a first type device. For example, the S/D regions may contain n-type dopants for an n-type or n-channel device or p-type dopants for a p-type or p-channel device. The S/D regions, in one embodiment, are heavily doped regions. For example, the dopant concentration of the S/D regions may be about $10^{18}$-$10^{20}$ atoms/cm$^3$. The depth or bottom of the S/D regions, for example, may be located at about the top surface of the isolation layer 160. Providing the bottom of the S/D regions at other locations in the fin structure may also be useful. For example, the bottom of the S/D regions may be located above or below the surface of the isolation layer. In other embodiments, the bottom of the S/D regions may occupy the fin structure. In some embodiments, the bottom of the S/D regions may extend below the bottom of the isolation layer into the isolation well in the substrate. A channel 136 is located in the upper portion of the fin between the S/D regions and below the gate.

In some embodiments, the S/D regions may be provided with S/D extension regions. The S/D extension regions may be lightly doped portions of the S/D regions. The S/D extension regions, for example, extend beneath the spacers to connect the channel to the S/D regions. In some embodiments, the S/D extension profile may extend beneath the gate. Providing a S/D extension profile which underlaps the gate may increase resistance and to have better short channel effect.

First and second S/D contact pads 142 and 152 may be provided. The first and second contact pads are coupled to the ends of the fin. For example, the first S/D contact pad is coupled to a first end of the fin and the second S/D contact pad is coupled to a second end of the fin. The contact pads may be rectangular in shape. Other shapes may also be useful. The contact pads, in one embodiment, may be integral parts of the fin. For example, the contact pads may be heavily doped with first polarity type dopants and may be an extension of the S/D regions. Other types or configurations of contact pads may also be useful. Contacts may be coupled to the S/D contact pads for coupling to the S/D regions.

A gate contact pad 132 may be provided on the isolation layer. The gate contact pad is coupled to, for example, an end of the gate. As shown, the gate is provided with one contact pad 132 disposed on a first end of the gate. The gate contact pad may be rectangular in shape. Other shapes may also be useful. The gate contact pad, in one embodiment, may be an integral part of the gate. Other types or configurations of gate contact pad may also be useful.

As shown, the gate wraps around the fin structure. For example, the gate covers the top and side surfaces of the fin structure, forming a tri-gate structure. Alternatively, a hard mask may be disposed over the top surface of the fin. In this case, the gate covers the side surfaces of the fin structure, forming a double-gate structure. In a conventional double gate configuration, the double gate is connected at the top and has one gate pad. In an alternative double gate configuration (also known as independent double gate configuration), the gate will disconnect on top of the fin and two gate pads may be provided to individually control the two separate gates. Furthermore, although a single fin structure is shown, some embodiments may include a plurality of fin structures configured in a closely packed manner. The fin structures may be controlled by a common gate. Such an arrangement forms, for example, multiple transistors arranged in a finger configuration to increase drive current. In other embodiment, the fin structures may be independently controlled by respective gates or a combination of common and independent gates.

Figure 2A:
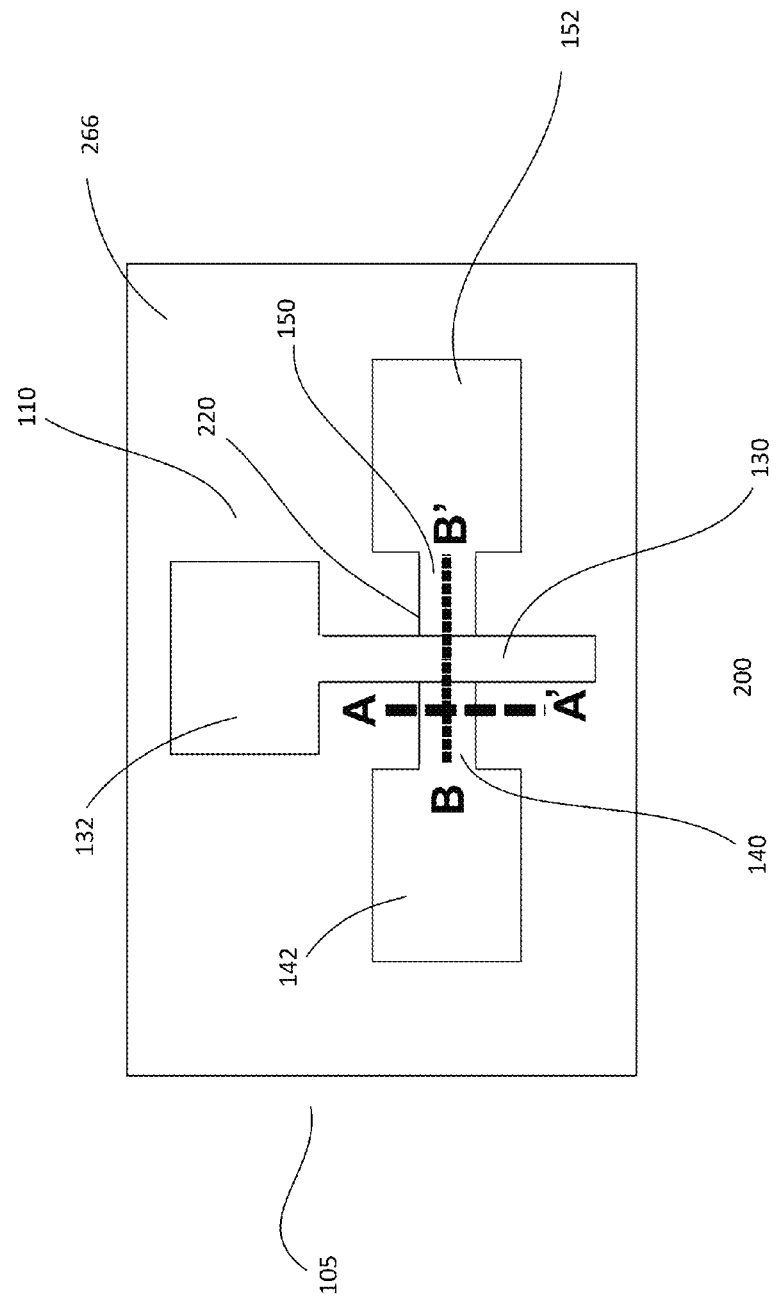
Figure 2B:
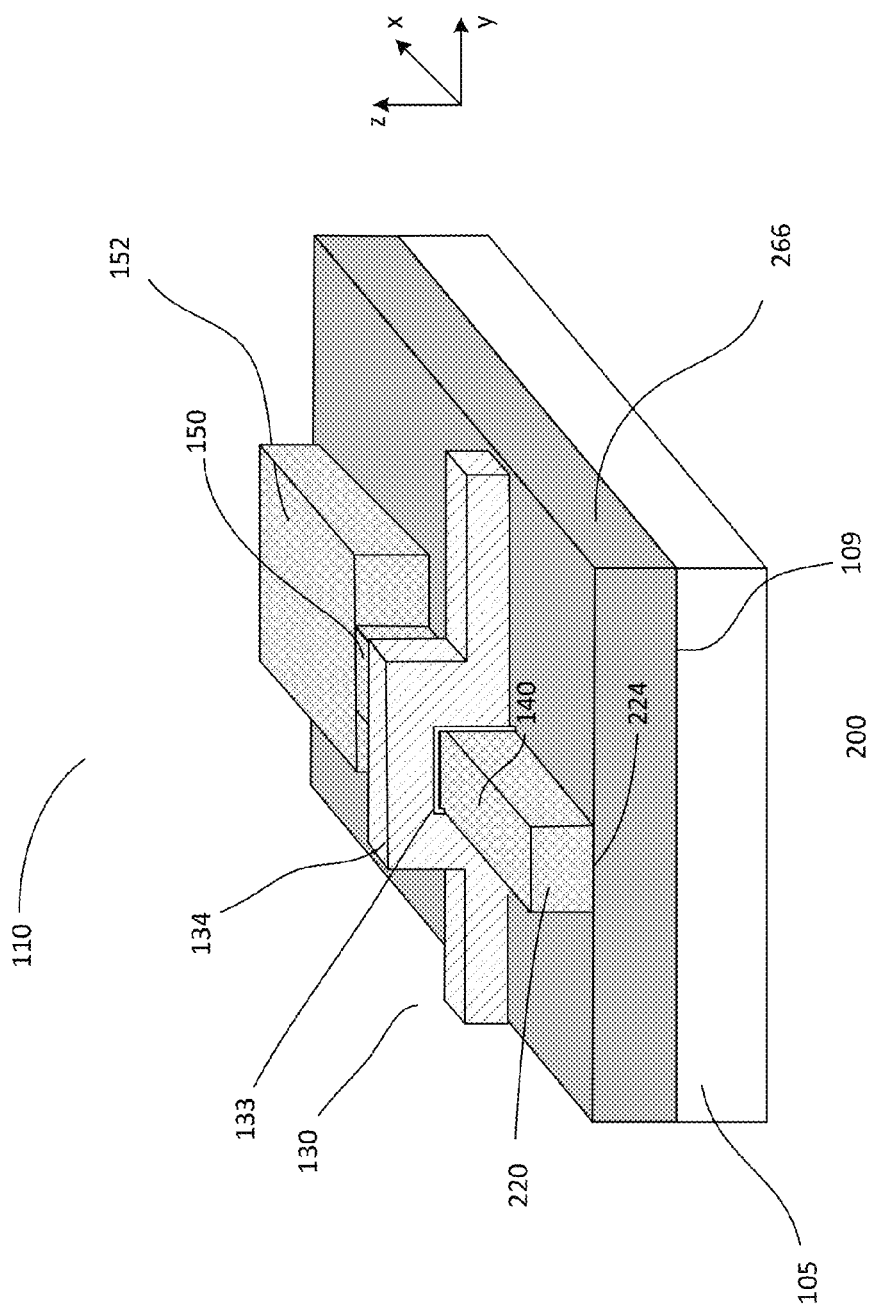

FIGS. 2a-2c show various views of another embodiment of a device 200. FIG. 2a shows a top view while FIG. 2b shows a 3-dimensional view of the device along A-A' and FIG. 2c shows a cross-sectional view of the device along B-B'. The device, for example, is similar to that described in FIGS. 1a-1c. Common features may not be discussed or discussed in detail.

As shown, a substrate 105 is provided with a device region which includes a finFET 110 disposed therein. An isolation buffer layer 266 is disposed on the top surface 109 of the substrate. The thickness of the isolation buffer layer should be sufficient to isolate the transistor from the substrate 105. The thickness of the isolation buffer layer, for example, is about 200-400 nm. In one embodiment, the thickness of the isolation buffer layer is about 230-350 nm in height. Other suitable thickness ranges may also be useful.

The isolation buffer layer, in one embodiment, is an α-Si layer. The α-Si layer is an integral part of the substrate. For example, the α-Si layer is formed by implanting the substrate with amorphizing dopants. The amorphizing dopants, for example, include silicon ions (Si$^+$). Other suitable types of amorphizing dopants, such as but not limited to Ge$^+$, may also be useful. Depending on the size of the amorphizing dopants, stress effects may be introduced. The dopants are implanted into the substrate by, for example, high energy implantation (HEI). The HEI, in one embodiment, is performed at 160 KeV with a dose of about 5e14-9e14 atom/cm$^2$. Providing other energies and doses may also be useful. The implant parameters, such as the energy and dose, may be tuned or tailored to produce amorphous layer having the desired depth and thickness to achieve the desired effect. For example, higher dose and energy may be employed to create a thicker amorphous layer. Implanting the amorphizing ions by cold or molecular/cluster implantation may also be useful. Other suitable types of techniques may also be used.

A fin 220 is disposed on the isolation buffer layer 266. The fin, for example, protrudes above the surface of the isolation buffer layer. The fin serves as the channel region of the transistor. For example, the fin is formed of a crystalline material. Exemplary height of the fin may be about 50-200 nm. In some embodiments, the height of the fin is about 60-150 nm. The width of the fin is about 10-100 nm. In some cases, the width of the fin may be included in determining the channel width of the device. Other dimensions for the fin may also be useful. The dimensions of the fin, for example, may depend on device or design requirements.

In one embodiment, the fin is an integral part of the substrate. For example, like the isolation buffer layer, the fin is part of the substrate. By implanting amorphizing dopants into the substrate, the isolation buffer layer is disposed within the substrate, forming a buried isolation buffer layer, with a top crystalline layer above it and the bulk substrate below. A vacancy rich crystalline layer is disposed above the interface 224 of the top crystalline layer and isolation buffer layer. The isolation buffer layer is sandwiched between the bulk substrate and top crystalline layer. By adjusting the energy and dose of the implant, the location and thickness of the isolation buffer can be controlled. This also controls the thickness or height of the top crystalline layer. The top crystalline layer is patterned to form the fin 220.

The transistor includes a gate 130 which traverses the fin. The sides of the gate may include dielectric sidewall spacers 139. First and second S/D regions 140 and 150 are disposed in the fin adjacent to the gate. A channel 136 is disposed in the fin between the S/D regions and under the gate. In some embodiments, the S/D regions may be provided with S/D extension regions.

First and second S/D contact pads 142 and 152 may be provided at ends of the fin. For example, the first S/D contact pad is coupled to a first end of the fin and the second S/D contact pad is coupled to a second end of the fin. The contact pads may be rectangular in shape. Other shapes may also be useful. The contact pads, in one embodiment, may be integral parts of the fin. For example, the contact pads may be heavily doped with first polarity type dopants and may be an extension of the S/D regions. Other types or configurations of contact pads may also be useful. Contacts may be coupled to the S/D contact pads for coupling to the S/D regions.

A gate contact pad 132 may be provided on the dielectric layer. The gate contact pad is coupled to, for example, an end of the gate. As shown, the gate is provided with one contact pad 132 disposed on a first end of the gate. The gate contact pad may be rectangular in shape. Other shapes may also be useful. The gate contact pad, in one embodiment, may be an integral part of the gate. The gate may be presented as a double-gate or tri-gate structure as described earlier. Other types or configurations of gate and gate contact pad may also be useful.

Figure 3D:
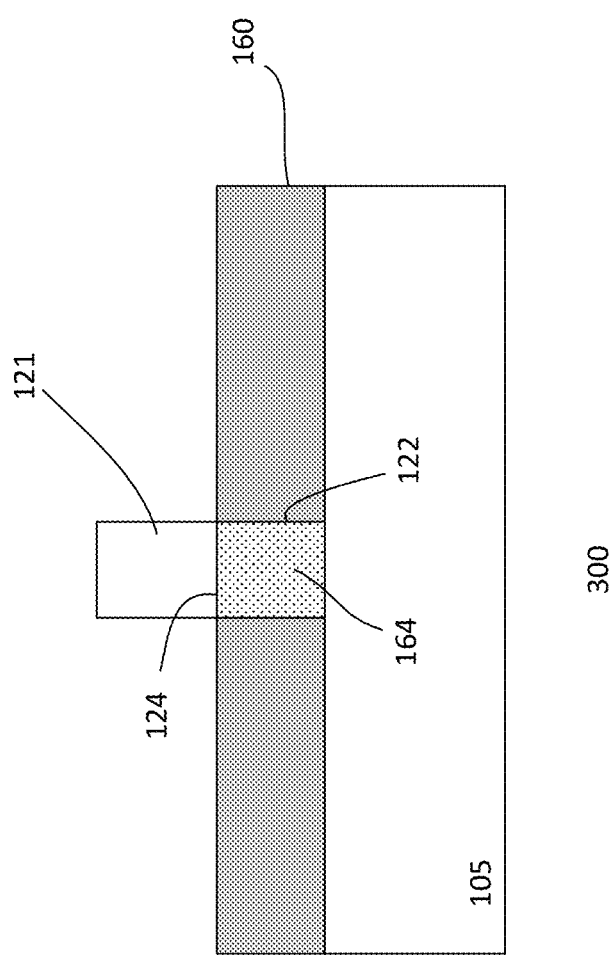

FIGS. 3a-3f show cross-sectional views of an embodiment of a process 300 for forming a device or IC. Referring to FIG. 3a, a substrate 105 is provided. The substrate may be a silicon substrate. The substrate may be lightly doped with, for example, p-type dopants. Providing other types of substrates, including SiGe, Ge and group III-V semiconductors such as GaAs, InP and InAs, including substrates doped with other types of dopants or undoped substrates, are also useful.

The substrate may be prepared with a device region. The device region, for example, serves as a region for a transistor. In one embodiment, the device region serves as a region for a finFET. Although the substrate is described with one device region, it is understood that the substrate may include numerous device regions (not shown). The numerous device regions may include different types of device regions.

Referring to FIG. 3b, the substrate is processed to form a fin structure 320. In one embodiment, the fin structure includes the body and contact regions of the transistor, such as that described in, for example, FIGS. 1a-1c. The height of the fin structure should be sufficient to provide a top and bottom fin portion which serves as a body of the transistor and an isolation buffer. The height of the fin, for example, may be about 250-600 nm. In other embodiments, the height of the fin may be about 350-400 nm. As for the width, it may be about 10-100 nm. Other fin dimensions may also be useful.

Forming the fin structure 120 may be achieved using various methods. The fin structure, for example, may be formed by patterning the substrate. For example, a patterned hard mask (not shown) is formed over the substrate. In one embodiment, a hard mask layer (not shown), such as silicon oxide or silicon nitride, is formed on the substrate 105. Other suitable types of materials which are selective to the isolation layer as will be described later may also be used as the hard mask layer. The hard mask layer may be formed by chemical vapor deposition (CVD). Other suitable types of hard mask or techniques for forming the hard mask may also be useful.

The hard mask layer is patterned to correspond to the shape of the fin structure 320. The patterning of the hard mask layer can be achieved by mask and etch techniques. For example, a patterned soft mask (not shown), such as photoresist, may be used as an etch mask to pattern the hard mask layer. The soft mask may be patterned by photolithography. To improve lithographic resolution, an ARC (not shown) may be provided beneath the photoresist. The pattern of the photoresist mask is transferred to the hard mask by, for example, an anisotropic etch, such as a reactive ion etch (RIE). The soft mask is removed. An anisotropic etch, such as a RIE, is performed to remove portions of the substrate surface unprotected by the hard mask, leaving a fin structure 320 as described above disposed on the top surface of the substrate. Other suitable methods may also be employed to form the fin structure. The hard mask (not shown), remains on the top surface of the fin.

The process continues to form the isolation layer. An isolation layer, such as a dielectric layer which includes a silicon oxide layer, is formed over the substrate covering the fin structure. Other suitable types of dielectric layer may also be useful. The isolation layer, for example, may be formed over the substrate using chemical vapor deposition (CVD) or high aspect ratio process (HARP). Other techniques for forming the isolation layer may also be useful. In one embodiment, a polishing process, such as a chemical mechanical polishing process (CMP) is performed to planarize the isolation layer to the top surface of the hard mask over the fin structure. A removal process, such as selective to the isolation layer which includes oxide material, is performed to remove or recess portions of the oxide to form the isolation layer 160 as shown in FIG. 3c. The removal process may include dry etch, wet etch or a combination thereof. The isolation layer 160, for example, has a height or thickness sufficient to provide isolation from the substrate below. The thickness of the isolation layer, for example, may be about 100-500 nm. In other embodiments, the thickness of the dielectric layer may be about 200-400 nm. Other suitable thickness ranges may also be useful.

Referring to FIG. 3d, an amorphizing implant is performed. The amorphizing implant amorphizes a bottom portion 122 of the fin. This forms an amorphous isolation buffer 164 in the bottom fin portion 122 of the fin. For example, the amorphized bottom fin portion serves as a buried isolation layer beneath the top fin portion to reduce S/D junction current leakage. In the case where the substrate is a silicon substrate, the amorphous isolation buffer is an α-Si layer. The amorphizing implant implants Si ions ($Si^+$) into the bottom fin portion. Implanting other suitable types of amorphizing dopants, such as but not limited to $Ge^+$, may also be useful. The implant, in one embodiment, is a HEI implant. The HEI implant is performed at, for example, 160 KeV with a dose of about 5e14-9e14 atom/$cm^2$. Providing other implant energies and doses may also be useful. The implant parameters, such as the energy and dose, may be tuned or tailored to produce an amorphized portion having the desired depth and thickness to achieve the desired effect. For example, higher dose and energy may be employed to create a thicker amorphized bottom portion. Implanting the amorphizing dopants by cold or molecular/cluster implantation may also be useful. Other suitable types of techniques may also be used.

By implanting amorphizing dopants into the fin structure, isolation buffer 164 is disposed in the bottom portion 122 of the fin. The top fin portion 121 remains crystalline. For example, the top fin portion remains as a crystalline silicon. A vacancy rich region, such as a HEI induced vacancy rich region, is disposed in the crystalline layer above the interface of the top and bottom fin portions. The isolation buffer is sandwiched between the substrate and top fin portion.

By adjusting the energy and dose of the implant, the location and thickness of the isolation buffer can be controlled. This also controls the thickness or height of the top fin portion. Exemplary thickness of the isolation buffer 164 may be about 200-400 nm. In one embodiment, the thickness of the isolation buffer may be about 230-350 nm. As for the top fin portion 121, it may be about 50-200 nm. In one embodiment, the top fin portion is about 60-150 nm. Providing other thicknesses for the top and bottom fin portions may also be useful. As shown, the interface 124 of the top and bottom fin portions may be disposed at about the top surface of the isolation layer 160. Providing the interface of the fin portions above or below the top surface of the isolation layer 160 may also be useful.

Figure 3E:
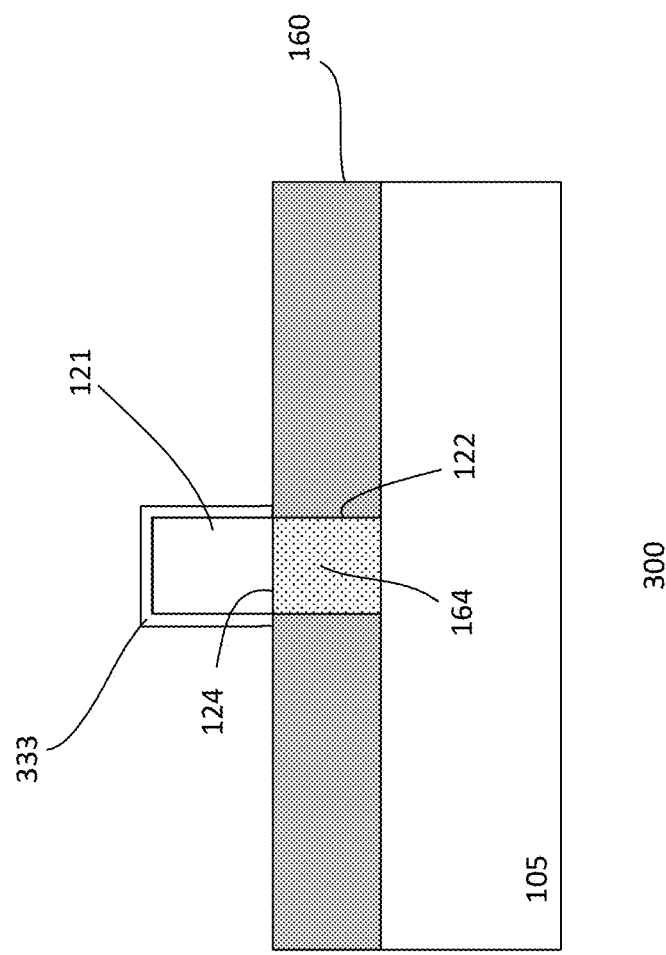

In FIG. 3e, a gate dielectric layer 333 is formed on the exposed surfaces of the fin structure, including the contact pads. The gate dielectric layer is formed of, for example, silicon oxide. In one embodiment, the gate dielectric layer is formed by thermal oxidation. The thermal oxidation may be performed in an oxidizing ambient, such as $O_2$. The oxidizing ambient may also include $N_2$. This forms a thermal silicon oxide layer on the surfaces of the fin structure. Forming other types of gate dielectric or using other techniques to form the gate dielectric layer may also be useful. For example, the process of forming a gate dielectric may form SiON, $HfO_2$ or HfSiON or other types of gate dielectric layer. The thickness of the gate dielectric layer may be, for example, about 10-100 Å. Other suitable gate dielectric thicknesses may also be useful.

The process continues to form a gate electrode layer 134 on the substrate, covering the isolation layer 160 and gate dielectric layer 333. The gate electrode layer, for example, is a polysilicon layer. The gate electrode layer may be formed by, for example, CVD. The gate electrode layer, for example, is conformally formed over the substrate, covering the gate dielectric 333 and the isolation layer 160. The thickness of the gate electrode layer, for example, may be about 400-1000 Å. Other suitable types of gate electrode layers, thicknesses or techniques for forming the gate electrode layer may also be useful. For example, the gate electrode layer may include TaN, TiN or other types of gate electrode material or may be formed by techniques such as atomic layered deposition (ALD) or sputtering.

The gate electrode layer may be doped to reduce resistance, adjust VT, adjust work function or a combination thereof. The type of dopants and dopant concentration may be appropriately selected based on the design requirements. The gate electrode layer may be in situ doped during formation or doped by ion implantation after the formation of the gate electrode layer.

Figure 3F:
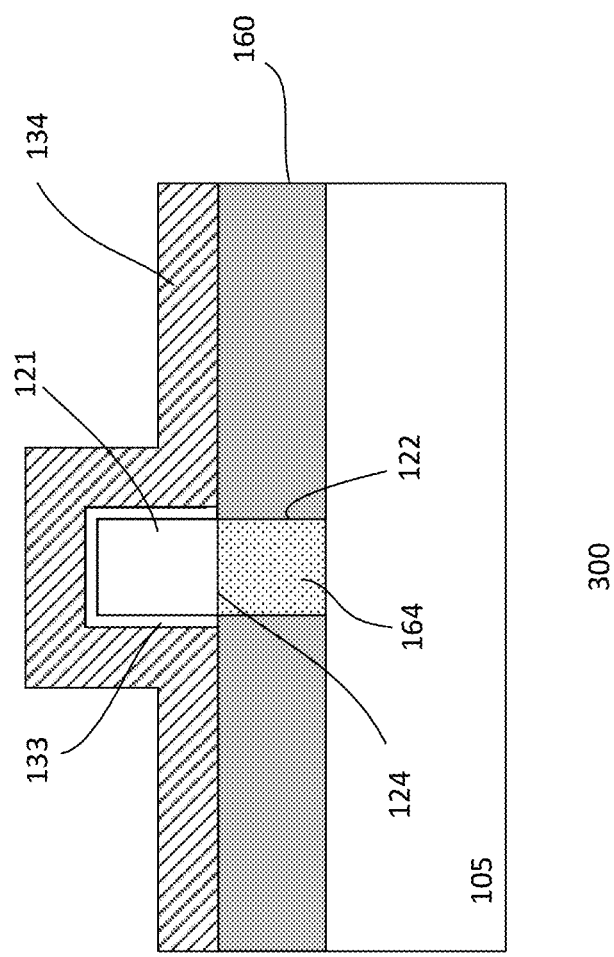

The gate layers, for example, gate dielectric and gate electrode, are patterned to form a gate 130 having gate dielectric 133 and gate electrode 134 as shown in FIG. 3f. The gate, in one embodiment, includes gate contact region. The gate, for example, traverses the fin. Patterning of the gate layers may be achieved using etch and mask techniques. For example, an RIE is employed using patterned soft mask, such as photoresist, as an etch mask to pattern the gate layers. To improve lithographic resolution, an ARC can be provided beneath the photoresist. Other techniques for patterning the gate layers may also be useful. After patterning the substrate to form the gate stack, the mask, including the ARC layer may be removed.

The process continues, for example, to form S/D regions in the fin structure adjacent to the gate. The S/D regions include first polarity type dopants. In one embodiment, lightly doped S/D extension regions are formed, for example, by ion implantation. The extensions are formed by, for example, implanting first polarity type dopants. The process parameters of the implantation, such as dose and energy, may be appropriately selected based on design requirements.

After the extension regions are formed, gate sidewall spacers may be formed on sidewalls of the gate. The gate sidewall spacers, for example, comprise silicon nitride. Other types of spacer materials, such as silicon oxide or silicon oxynitride, may also be useful. To form sidewall spacers, a spacer dielectric layer is deposited on the substrate. The spacers can be formed by using various techniques, such as plasma enhanced chemical vapor deposition (PECVD). Other techniques for forming the spacer dielectric layer or forming other types of spacers may also be useful. The spacer dielectric layer is subsequently anisotropically etched, such as by RIE, to remove horizontal portions, leaving non-horizontal portions on the sidewalls as the spacers.

Heavily doped S/D regions with first polarity type dopants are formed. The heavily doped S/D regions are formed by, for example, implanting first polarity type dopants. The process parameters of the implantation, such as dose and energy, may be appropriately selected based on design requirements. In some embodiments, the S/D extension regions may be formed along with forming the S/D regions after spacer formation. Silicide contacts may be formed on the contact regions of the device, such as S/D contact regions and gate contact regions.

As described earlier, a vacancy rich region, such as a HEI induced vacancy rich region, is disposed in the top crystalline fin portion. The vacancy rich region is advantageous for dopant activation and S/D junction. During the S/D junction doping, the dopants will be more readily activated as there are excess vacancies present in the vacancy rich region. The vacancies facilitate fast and easy dopant activation with reduced thermal budget. Thus, the HEI technique employed provides a method to form good junction characteristics as well as with a low post-implant temperature anneal.

The process further continues to form, for example, a dielectric layer (not shown). The dielectric layer may be a pre-metal dielectric (PMD) layer. Contacts to the contact pads may be formed in the transistor. Additional processes may include forming of one or more interconnect levels, final passivation, dicing, assembly, packaging and testing. Other processes are also useful. For example, other components, such as low voltage, medium voltage, and high voltage I/O devices can be formed prior to forming the interconnections.

Figure 4A:
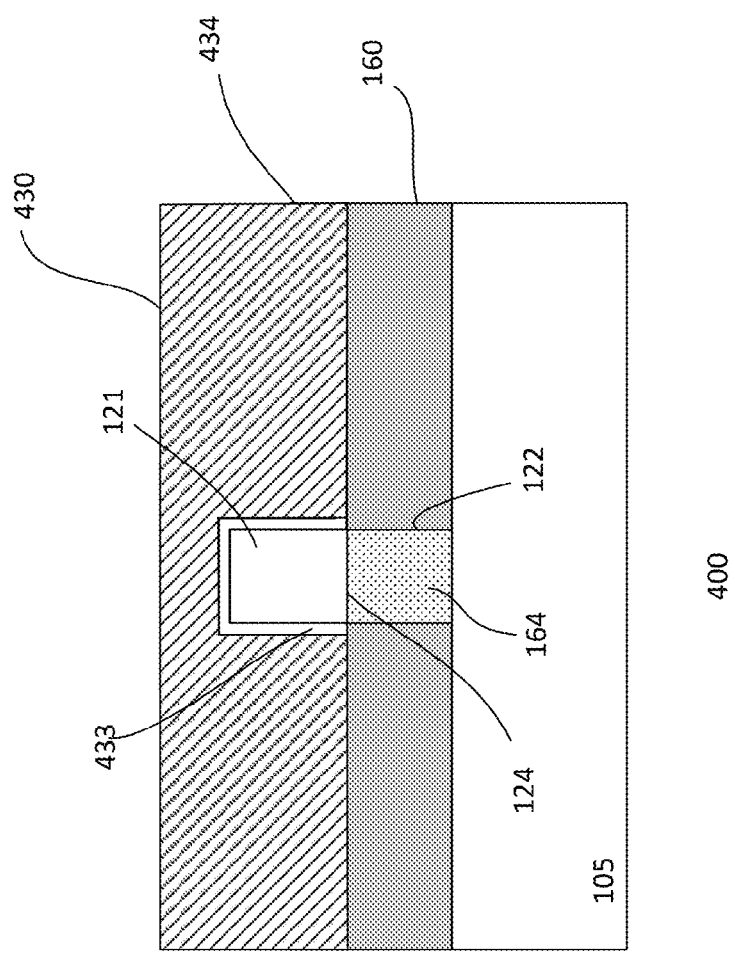

FIGS. 4a-4d show cross-sectional views of another embodiment of a process 400 for forming a device or IC. FIG. 4a shows a substrate 105 which is similarly processed as shown in FIG. 3f. For example, the substrate is processed to include a patterned gate with sidewall spacers, S/D regions and an isolation buffer disposed in the bottom portion of the fin. In one embodiment, the patterned gate serves as a dummy gate 430. For example, the dummy gate includes a dummy gate dielectric 433 and a dummy gate electrode 434 which is conformally formed over the substrate similar to that shown in FIG. 3f, except that the dummy gate electrode layer may be as thick as the thickness of the top fin portion. Alternatively, the dummy gate electrode may not be conformally formed over the substrate, such as that shown in FIG. 4a. Providing other suitable configuration of the dummy gate electrode may also be useful. In the case of a dummy gate, it may be formed of any type of material which can be selectively removed from the fin and subsequently formed dielectric layer. For example, the dummy gate electrode layer may include polysilicon while the dummy gate dielectric layer may include silicon nitride or silicon oxide. Other suitable types of materials may also be used for the dummy gate.

Figure 4B:
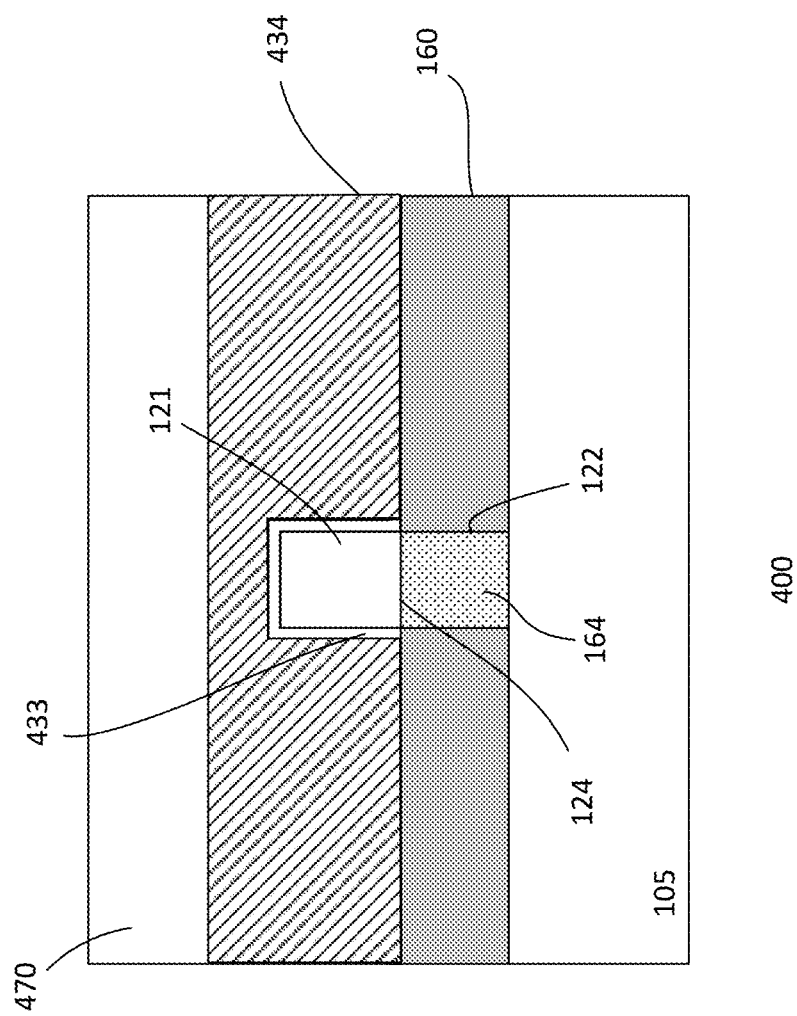

Referring to FIG. 4b, a dielectric layer 470 is formed on the substrate, covering the fin and gate. The dielectric layer, for example, serves as an ILD layer. In one embodiment, if the dummy gate dielectric is silicon nitride, the dielectric layer is a silicon oxide layer. Alternatively, if the dummy gate dielectric is silicon oxide, the dielectric layer is a silicon nitride layer. Other suitable types of dielectric layer may also be useful.

As shown in FIG. 4c, the ILD layer is planarized. The planarizing process, for example, is a chemical mechanical polishing (CMP) process. The planarizing process removes excess ILD or dielectric layer forming a co-planar top surface 472 with the dummy gate.

After planarization, the exposed dummy gate is selectively removed. Removal of the dummy gate may be performed by dry etch, wet etch or a combination thereof. For example, a wet etch selective to the ILD layer (not shown) and sidewall spacers (not shown) may be performed. The dummy gate may be removed by wet etch using different chemistries. Removal of the dummy gate leaves a gate trench or gate opening on the substrate.

Figure 4D:
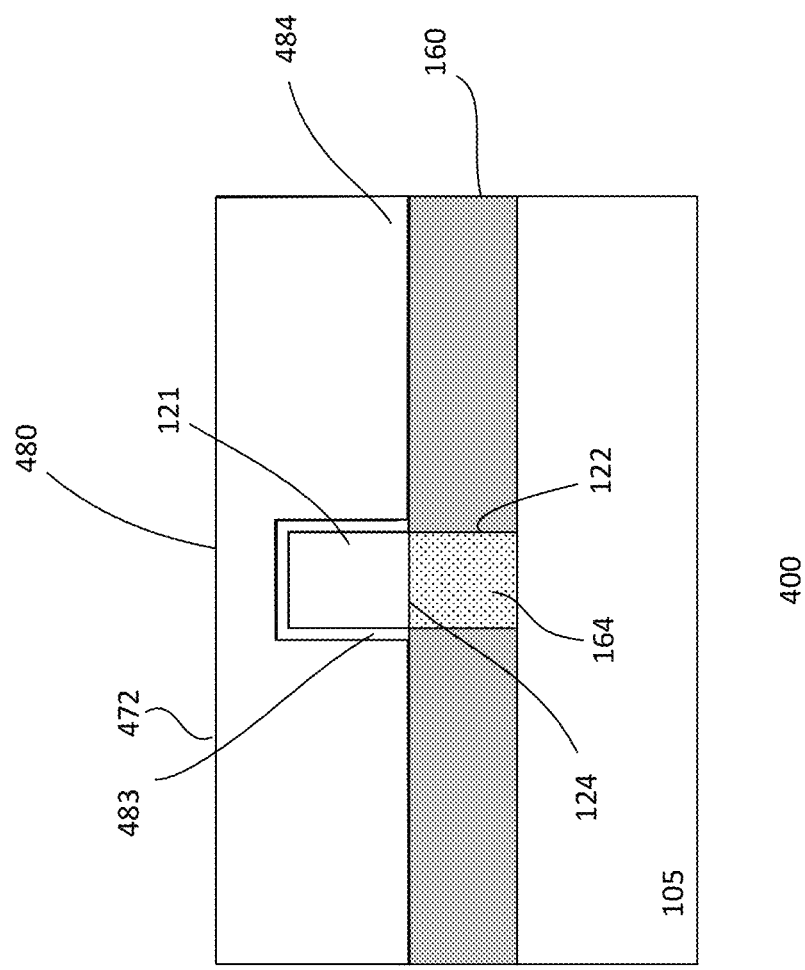

In one embodiment, a metal gate 480 is formed on the substrate in the gate trench as shown in FIG. 4d. Forming the metal gate includes forming a high-k gate dielectric layer 483 on the substrate. The gate dielectric layer lines the gate trench and ILD layer (not shown). The high-k gate dielectric layer, for example, may be $HfO_2$, HfSiON, $La_2O_3$, zirconium oxide or silicates thereof formed by atomic layer deposition (ALD) process. A metal gate electrode layer 484, such as TaN or TiN, may be formed over the gate dielectric layer by ALD, CVD or physical vapor deposition (PVD). A work function tuning layer may be formed in between the metal gate electrode and the high-k gate dielectric layer. Other types of gate dielectric materials, electrode materials or forming techniques may also be useful. These layers are planarized, forming a planar top surface between the ILD, gate dielectric and gate electrode.

After forming the metal gate, the process continues to form the device. Additional processes may be performed to complete the device. For example, additional processes include forming contacts to the transistor. For example, contact openings are formed to the contact pads onto the exposed contact regions. Silicide contacts may be formed on exposed source/drain contact regions. Contact plugs are formed in the contact openings with the silicide contacts. Additional processes may include back end of line process to finish the manufacturing of the device, such as forming of one or more interconnect levels, final passivation, dicing, assembly, packaging and testing. Other processes are also useful. For example, other components, such as low voltage, medium voltage, and high voltage I/O devices can be formed prior to forming the interconnections.

Figure 5A:
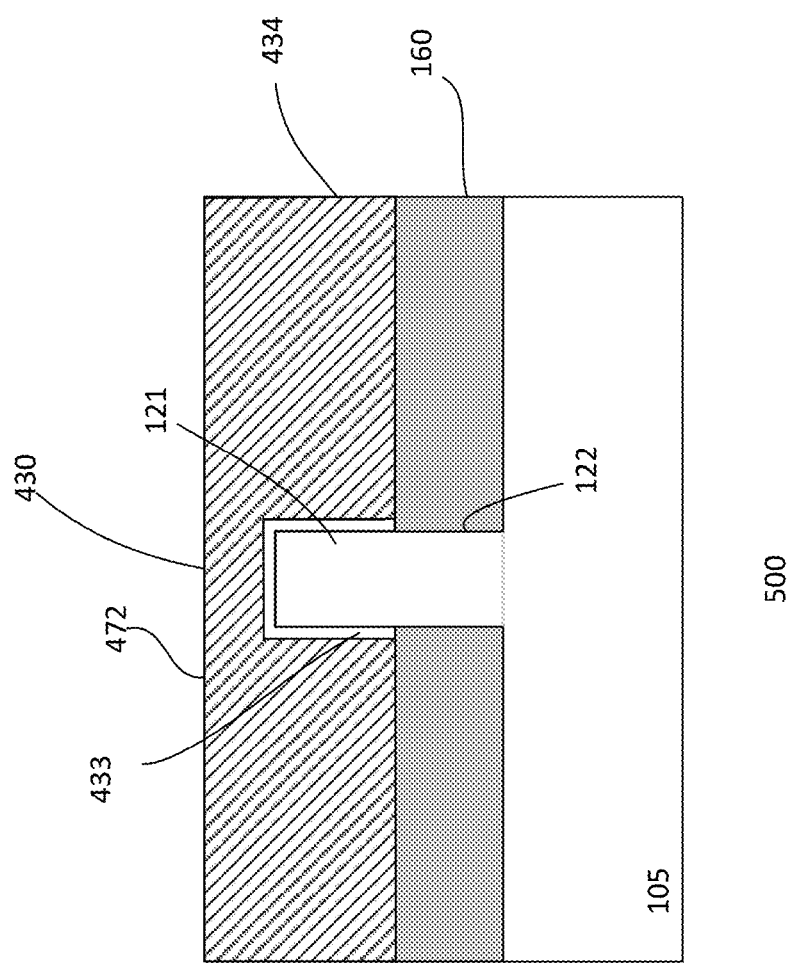
FIGS. 5a-5c show another embodiment of a process for forming a device.
Figure 5B:
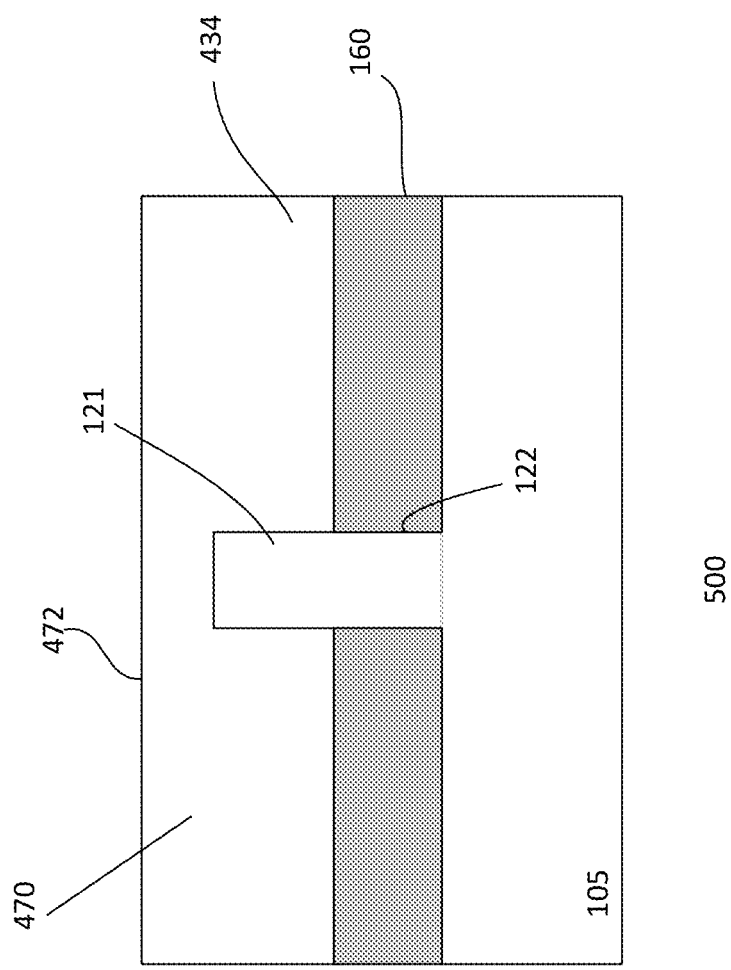
Figure 5C:
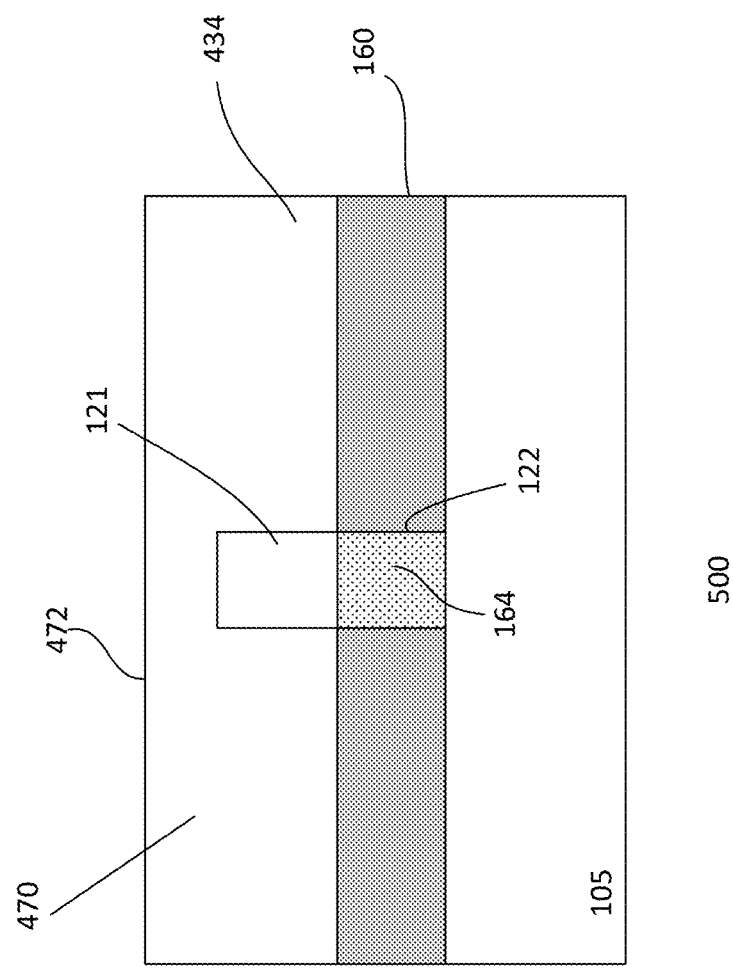

FIG. 5a-5c shows a cross-sectional view of another embodiment of a process 500 for forming a device or IC. As shown in FIG. 5a, a substrate 105 is processed as in FIG. 4c. For example, the substrate is processed to include a patterned dummy gate 430 and ILD layer (not shown). Unlike the device shown in FIG. 4c, no isolation buffer has been formed in a bottom portion 122 of the fin.

Referring to FIG. 5b, the dummy gate is removed. Removal of the dummy gate leaves a gate trench on the substrate, exposing sides of the ILD layer 470 adjacent to the gate trench. After removal, an amorphizing implant is performed. The amorphizing implant amorphizes a bottom portion of the fin. This forms an amorphous isolation buffer 164 in the bottom fin portion of the fin as shown in FIG. 5c. In the case where the substrate is a silicon substrate, the amorphous isolation buffer is an α-Si layer. The amorphizing implant implants Si ions ($Si^+$) into the bottom fin portion. Other suitable types of amorphizing dopants, such as but not limited to $Ge^+$, may also be useful. The implant, in one embodiment, is a HEI implant. The HEI implant is performed at, for example, 160 KeV with a dose of about 5e14-9e14 atom/$cm^2$. Providing other implant energies and doses may also be useful. The implant parameters, such as the energy and dose, may be tuned or tailored to produce amorphous portion having the desired depth and thickness to achieve the desired effect. For example, higher dose and energy may be employed to create a thicker amorphous portion. Implanting the amorphizing dopants by cold or molecular/cluster implantation may also be useful. Other suitable types of techniques may also be used. After forming the isolation buffer layer, the process continues to form the metal gate and complete the device, as described in FIG. 4d.

Figure 6B:
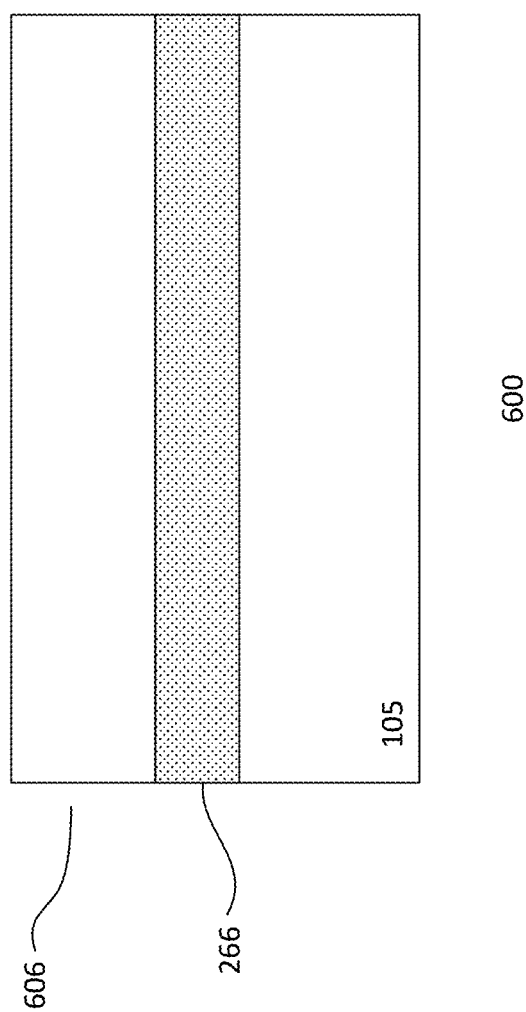

FIG. 6a-6d shows a cross-sectional view of another embodiment of a process 600 for forming a device or IC. As shown in FIG. 6a, a substrate 105 is provided. The substrate is similar to that shown in FIG. 3a.

Referring to FIG. 6b, an amorphizing implant is performed. The amorphizing implant amorphizes a portion of the substrate. This forms a buried amorphous isolation buffer layer 266 in the buried portion of the substrate. For example, the buried amorphous isolation buffer layer 266 is disposed between a crystalline top substrate portion 606 and a bulk substrate 105. In the case where the substrate is a silicon substrate, the amorphous isolation buffer is an α-Si layer. The amorphizing implant implants Si ions ($Si^+$) into the buried portion of the substrate. Other suitable types of amorphizing dopants, such as but not limited to $Ge^+$, may also be useful. The implant, in one embodiment, is a HEI implant. The HEI implant is performed at, for example, 160 KeV with a dose of about 5e14-9e14 atom/$cm^2$. Providing other implant energies and doses may also be useful. The implant parameters, such as the energy and dose, may be tuned or tailored to produce amorphous layer having the desired depth and thickness to achieve the desired effect. For example, higher dose and energy may be employed to create a thicker amorphous layer. Implanting the amorphizing dopants by cold or molecular/cluster implantation may also be useful. Other suitable types of techniques may also be used.

By adjusting the energy and dose of the implant, the location and thickness of the buried isolation buffer layer can be controlled. This also controls the thickness or height of the top substrate portion. Exemplary thickness of the isolation buffer may be about 200-400 nm. In one embodiment, the thickness of the isolation buffer may be about 230-350 nm. As for the top substrate portion, it may be about 50-200 nm. In one embodiment, the top substrate portion is about 60-150 nm. Providing other thicknesses for the top substrate portion and buried isolation layer may also be useful.

Figure 6C:
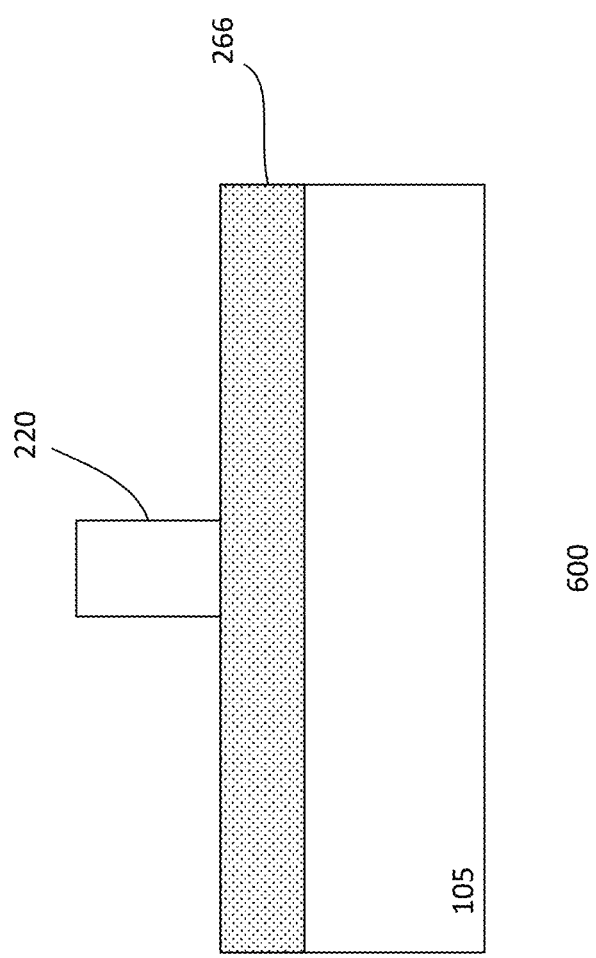

As shown in FIG. 6c, the substrate is patterned to form a fin 220. The substrate may be patterned using etch and mask techniques, for example, similar to that described in FIG. 3b. The etch may be selective to the amorphous buried isolation layer. This forms a crystalline fin above the amorphous isolation layer. For example, the fin extends above the amorphous isolation layer. In FIG. 6d, a gate dielectric layer 333 is formed on the exposed surface of the fin. The gate dielectric layer may be formed similarly as described in, for example, FIG. 3e. After forming the gate dielectric layer, the process continues as described in FIGS. 3e-3f. In some cases, for example, the process continues to form a metal gate. In such cases, the process may include those described in FIG. 4c and onwards.

The embodiments as described above, for example, include a fin-type transistor. It is understood that the amorphized portion used to reduce current leakage and the method to form the amorphized portion of layer is applicable to any suitable types of transistors, including non-fin type of transistors.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a device comprising:
   providing a substrate prepared with a device region;
   forming a fin in the device region, the fin includes top and bottom portions;
   forming a gate over the top portion of the fin;
   forming source/drain (S/D) regions in the top portion of the fin; and
   forming an amorphous isolation buffer at least in the bottom fin portion below the gate, leaving the top fin portion crystalline, wherein the amorphous isolation buffer reduces S/D junction current leakage.

2. The method of claim 1 comprising:
   forming an isolation layer on the substrate, wherein the isolation layer has a top isolation surface disposed below a top fin surface, leaving an upper fin portion exposed.

3. The method of claim 2 wherein forming the amorphous isolation buffer comprising:
   performing an amorphizing implant, wherein the amorphizing implant amorphizes the bottom portion of the fin.

4. The method of claim 3 wherein the amorphizing implant implants Si ions ($Si^+$) into the bottom fin portion.

5. The method of claim 3 wherein the amorphizing implant is performed by high energy implant (HEI) or by cold or molecular/cluster implantation.

6. The method of claim 5 wherein the high energy implant creates a vacancy rich region in the top fin portion.

7. The method of claim 3
   wherein the gate serves as a dummy gate and comprising:
   forming an interlevel dielectric (ILD) layer on the substrate covering the fin, dummy gate and isolation layer;
   performing a planarization process to form a top ILD surface which is about co-planar with top surface of the dummy gate; and
   removing the dummy gate after the planarization process.

8. The method of claim 7 wherein removing the dummy gate forms a gate trench and comprising forming a metal gate within the gate trench.

9. The method of claim 2 wherein the gate is a metal gate and comprising:
   forming a dummy gate wrapping around the fin;
   forming an interlevel dielectric (ILD) layer on the substrate covering the fin, dummy gate and isolation layer;
   performing a planarization process to form a top ILD surface which is about co-planar with top surface of the dummy gate; and
   removing the dummy gate after the planarization process.

10. The method of claim 9 wherein:
    removing the dummy gate forms a gate trench;
    forming the amorphous isolation buffer is performed after removing the dummy gate, and comprising
    forming the metal gate within the gate trench.

11. The method of claim 10 wherein the amorphous isolation buffer is formed by performing an amorphizing implant, wherein the amorphizing implant amorphizes the bottom portion of the fin.

12. The method of claim 1 wherein forming the amorphous isolation buffer comprising:
    performing an amorphizing implant to amorphize a portion of the substrate to form a buried amorphous isolation buffer layer in a buried portion of the substrate, wherein the bottom fin portion is part of the buried portion of the substrate and the buried amorphous isolation buffer layer is formed between a crystalline top substrate portion and a bulk substrate.

13. The method of claim 12 wherein the amorphizing implant is performed prior to forming the fin.

14. A method for forming a device comprising:
    providing a substrate prepared with a device region;
    forming a transistor in the device region, the transistor includes a gate disposed over the substrate;
    forming source/drain (S/D) regions adjacent to the gate; and
    forming an amorphous isolation buffer at least below the gate, wherein the amorphous isolation buffer reduces S/D junction current leakage.

15. A device comprising:
    a substrate prepared with a device region;
    a fin in the device region, the fin includes top and bottom portions;
    a gate over the top portion of the fin;
    source/drain (S/D) regions disposed in the top portion of the fin; and
    an amorphous isolation buffer disposed at least in the bottom fin portion below the gate and the top fin portion being crystalline, wherein the amorphous isolation buffer reduces S/D junction current leakage.

16. The device of claim 15 comprising:
    an isolation layer disposed on the substrate, wherein the isolation layer has a top isolation surface disposed below a top fin surface, leaving an upper fin portion exposed.

17. The device of claim 15 wherein the amorphous isolation buffer comprises a buried amorphous isolation buffer layer in a buried portion of the substrate, wherein the bottom fin portion is part of the buried portion of the substrate and the buried amorphous isolation buffer layer is disposed between a crystalline top substrate portion which is the top fin portion and a bulk substrate.

18. The method of claim 14 wherein forming the amorphous isolation buffer comprising:
    performing an amorphizing implant to amorphize a portion of the substrate to form a buried amorphous isolation buffer layer in a buried portion of the substrate, wherein the buried amorphous isolation buffer layer is formed between a crystalline top substrate portion and a bulk substrate.

19. The method of claim 18 wherein the amorphizing implant is performed by high energy implant (HEI) or by cold or molecular/cluster implantation.

20. The method of claim 18 wherein the amorphizing implant implants Si ions ($Si^+$) or Ge ions ($Ge^+$).

* * * * *